US012772811B2

(12) United States Patent
Clark et al.

(10) Patent No.: US 12,772,811 B2
(45) Date of Patent: Oct. 20, 2026

(54) SILICIDATION PROCESS FOR SEMICONDUCTOR DEVICES

(71) Applicant: Tokyo Electron Limited, Tokyo (JP)

(72) Inventors: Robert D. Clark, Leuven (BE); Steven Consiglio, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 482 days.

(21) Appl. No.: 18/295,656

(22) Filed: Apr. 4, 2023

(65) Prior Publication Data

US 2023/0326764 A1 Oct. 12, 2023

Related U.S. Application Data

(60) Provisional application No. 63/329,260, filed on Apr. 8, 2022.

(51) Int. Cl.

| | |
|---|---|
| ***H10P 95/90*** | (2026.01) |
| ***H10P 14/40*** | (2026.01) |
| ***H10P 14/692*** | (2026.01) |
| ***H10P 50/26*** | (2026.01) |
| ***H10P 50/66*** | (2026.01) |

(52) U.S. Cl.

CPC .......... *H10P 95/904* (2026.01); *H10P 14/412* (2026.01); *H10P 14/6939* (2026.01); *H10P 50/267* (2026.01); *H10P 50/667* (2026.01)

(58) Field of Classification Search

CPC ................................................ H01L 21/28518

See application file for complete search history.

(56) References Cited

U.S. PATENT DOCUMENTS

| | | | | |
|---|---|---|---|---|
| 5,926,737 A * | 7/1999 | Ameen | ............. | H01L 21/28518 257/E21.311 |
| 6,339,021 B1 | 1/2002 | Tan et al. | | |
| 7,205,234 B2 | 4/2007 | Wu et al. | | |
| 10,312,096 B2 | 6/2019 | Chung et al. | | |
| 2006/0121665 A1 * | 6/2006 | Fang | ................. | H10D 84/0174 438/682 |
| 2006/0286740 A1 | 12/2006 | Lin et al. | | |
| 2008/0242059 A1 | 10/2008 | McSwiney et al. | | |
| 2010/0155859 A1 | 6/2010 | Raaijmakers | | |

(Continued)

FOREIGN PATENT DOCUMENTS

| | | |
|---|---|---|
| KR | 20020002739 A | 1/2002 |
| KR | 20120045570 A | 5/2012 |

OTHER PUBLICATIONS

Machine translation of KR-2012045570-A (Year: 2012).*

(Continued)

*Primary Examiner* — Erik Kielin

(74) *Attorney, Agent, or Firm* — Slater Matsil, LLP

(57) ABSTRACT

A method of forming a device includes providing a substrate containing an exposed semiconductor region, forming a metal oxide film over the exposed semiconductor region, and forming an oxygen-scavenging metal film over the metal oxide film. The method includes chemically reducing the metal oxide film to an elemental metal film by scavenging oxygen from the metal oxide film into the oxygen-scavenging metal film; and reacting the elemental metal film with the semiconductor region to form a metal-semiconductor layer, the metal-semiconductor layer forming a source/drain contact region of a transistor.

19 Claims, 10 Drawing Sheets

(56) References Cited

U.S. PATENT DOCUMENTS

| | | | | |
|---|---|---|---|---|
| 2011/0269310 | A1 | 11/2011 | Raaijmakers | |
| 2013/0115768 | A1 * | 5/2013 | Pore | H10D 64/62 438/680 |
| 2014/0210011 | A1 | 7/2014 | Baraskar et al. | |
| 2015/0243565 | A1 * | 8/2015 | Nieh | H01L 21/28518 257/369 |
| 2017/0148888 | A1 | 5/2017 | Clark et al. | |
| 2017/0186624 | A1 | 6/2017 | Woodruff | |
| 2024/0274834 | A1 * | 8/2024 | Mui | H01M 4/75 |

OTHER PUBLICATIONS

Wilson, Rachel L., et al., "Chemical vapour deposition (CVD) of nickel oxide using the novel nickel dialkylaminoalkoxide precursor [Ni(dmam')2] (dmamp' 2-dimethylamino-2-methyl-1-propanolate)," RSC Advances, 2021, 11, Royal Society of Chemistry, Jun. 15, 2021, 7 pages.

International Search Report and Written Opinion; PCT Application No. PCT/US2023/017743, mailed Jul. 31, 2023, 10 pages.

Taiwan Office Action; Taiwanese Application No. 112113032, mailed Jul. 29, 2026, 4 pages.

* cited by examiner

SILICIDATION PROCESS FOR SEMICONDUCTOR DEVICES

CROSS-REFERENCE TO RELATED APPLICATIONS

This application claims the benefit of U.S. Provisional Application No. 63/329,260 filed on Apr. 8, 2022, which application is hereby incorporated herein by reference.

TECHNICAL FIELD

The invention relates generally to the field of semiconductor device manufacturing and, more particularly, to silicidation processes.

BACKGROUND

For most advanced semiconductor devices complementary metal-oxide semiconductor (CMOS) technology is employed. CMOS technology utilizes p-type and n-type metal-oxide semiconductor field effect transistors (MOSFETs) in complementary pairs for logic functions. It is desirable to have MOSFETs with a high drive current when the devices are on in order to achieve a low delay when switching the device. In order to achieve a high drive current, various source and drain (source/drain) structures have been employed in order to maximize the drive current of the MOSFETs by imparting strain to the channel region of the device and/or by minimizing the contact resistivity to the source/drain of the MOSFETs. In many advanced MOSFETs epitaxial semiconductor layers with high doping are employed in the source/drain of the MOSFETs. For instance, highly doped epitaxial silicon, or carbon doped silicon, (Si:C) is frequently employed for the source/drain structures of n-type silicon MOSFETs (nMOSFETs) while highly doped epitaxial germanium doped silicon (SiGe) is frequently employed for the source/drain structures of p-type MOSFETs (pMOSFETs). When forming advanced MOSFETs, part of the semiconductor that is present in the source and drain structures of the MOSFETs can be converted into low-resistivity metal silicides. This is done to provide a conductive path with a low bulk resistivity in the device, and to ensure a good contact resistance. Nickel, cobalt and titanium silicides, for example, have been used for this process in silicon MOSFETs. In some cases it is beneficial to have different silicides in the source/drain of the nMOSFETs and pMOSFETs of the CMOS devices due to a better band alignment with the conduction band (for nMOSFETs) and valence band (for pMOSFETs) of the semiconductors employed in the source/drain structures. For example it can be beneficial to employ titanium silicides or titanium carbon doped silicides (silicon-carbides) for nMOSFET source/drain contacts and nickel silicides or nickel silicon-germanides for pMOSFET source/drain contacts due to the respective band alignments.

Formation of nickel silicide (NiSix) is used as a representative illustrative embodiment. A process for forming $NiSi_x$ on a substrate (e.g., a wafer) includes depositing a nickel metal film (Ni), usually through a physical vapor deposition (PVD, e.g., sputtering) or chemical vapor deposition (CVD) process onto a silicon containing semiconductor region. The substrate is heated to a temperature at which the Ni reacts with the Si in the underlying substrate to form a nickel silicide ($NiSi_x$). Depending on the annealing temperature, $NiSi_x$ can include $Ni_2Si$, NiSi, $NiSi_2$ and/or a mixture thereof. Usually, the temperature is kept low enough to avoid formation of $NiSi_2$, which has a relatively high electrical resistivity.

The presence of the $NiSi_x$ allows the formation of a conductive path with a low bulk resistivity and a good contact resistance. However, this process may not be effective for all semiconductor devices. For example, for certain semiconductor structures, such as nonplanar multiple gate transistors, the step coverage of the Ni metal film over the three-dimensional structure is poor due to the limitations in the PVD or CVD process for depositing the Ni metal film. Variation in thicknesses due to a non-uniform deposition of the Ni film creates variation in resistivities and Si consumption across the structures on the surface of a substrate. Such variation is undesirable because it can introduce non-uniformities in the electrical performance of electrical devices formed using the $NiSi_x$ films.

Attempts to deposit a Ni metal film by more conformal processes like atomic layer deposition (ALD) have not been straightforward. Accordingly, there is a need for new methods of forming conformal $NiSi_x$ films having more uniform resistivities on complex structures, and in combination with other metal silicides in a complementary fashion.

SUMMARY

A method of forming a device includes providing a substrate containing an exposed semiconductor region, forming a metal oxide film over the exposed semiconductor region, and forming an oxygen-scavenging metal film over the metal oxide film. The method includes chemically reducing the metal oxide film to an elemental metal film by scavenging oxygen from the metal oxide film into the oxygen-scavenging metal film; and reacting the elemental metal film with the semiconductor region to form a metal-semiconductor layer, the metal-semiconductor layer forming a source/drain contact region of a transistor.

A method of forming source/drain regions includes providing a substrate containing first and second exposed semiconductor regions, selectively forming a metal oxide film over the first semiconductor region, and forming an oxygen-scavenging metal film over the first and second semiconductor regions. The method includes chemically reducing the metal oxide film to an elemental metal film by scavenging oxygen from the metal oxide film into the oxygen-scavenging metal film. The method includes reacting the elemental metal film with the first semiconductor region to form a metal semiconductor film, and reacting the oxygen-scavenging metal film with the second semiconductor region to form an oxygen-scavenging metal semiconductor film.

A method of forming a device includes providing a substrate containing first and second semiconductor regions, selectively forming a nickel oxide film over the first semiconductor region, and forming a titanium metal film over the first and second semiconductor regions. The method includes chemically reducing the nickel oxide film to an elemental nickel metal film by oxygen scavenging from the nickel oxide film to the titanium metal film. The method includes reacting the elemental nickel metal film with the first semiconductor region to form a nickel semiconductor film; and reacting the titanium metal film with the second semiconductor region to form a titanium semiconductor film, where the chemically reducing step and the reacting steps include a heat-treating step.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
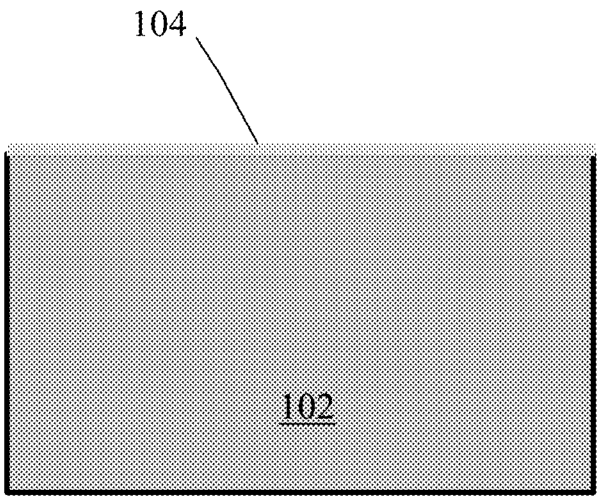
FIGS. 1A through 1E are cross sectional views of the major processing steps for formation of a metal silicide film on a substrate in accordance with embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. For example, when this application refers to metal silicide formation or silicidation it will be apparent to persons skilled in the art that a similar process could be employed to form a metal germanide, metal silicon-carbide, metal silicon-germanide, metal tin-germanide or metal indium-gallium-arsenide with adjusted conditions appropriate for the semiconductor layer employed in the source/drain structure. It will also be apparent to those skilled in the art that optimum conditions for the process may depend upon both the elemental composition and morphology/crystallinity of the semiconductor layers employed in the source/drain region.

As semiconductor structures become more advanced, new methods for silicidation are needed in order to form uniform self-aligned silicide layers on planar and three-dimensional structures. Conventional physical vapor deposition (PVD) and chemical vapor deposition (CVD) methods of silicidation are most effective when the desired regions of silicide deposition are mainly horizontal surfaces. In situations in which the desired regions of silicide formation include vertical regions, such as the walls of three-dimensional transistors such as finFETs and gate all around FETs, the traditional methods utilizing physical vapor deposition (PVD) and chemical vapor deposition (CVD) can degrade the three-dimensional (3D) transistor's performance by consuming too much of the substrate to form the silicide and by depositing non uniformly over the 3D surface and forming a nonuniform silicide. This is because traditional methods of PVD silicidation require relatively thick films to be deposited to compensate for poor step coverage, and traditional methods of CVD can deposit non uniformly across the three-dimensional structures resulting in non-uniform resistivities.

Embodiments of the invention address the above problem and other problems with silicidation by depositing a metal oxide film on a wafer by atomic layer deposition, and then converting the metal oxide film to a metal film using an oxygen-scavenging metal film in direct physical contact with the metal oxide film to scavenge oxygen from the metal oxide film converting it to a metal film. Once the metal film is formed, it can be converted to a silicide in a self-aligned silicidation process using a heat-treatment. The ALD process can include multiple cycles, where each cycle comprises pulsing a vaporized metal precursor into the reaction chamber to form a molecular monolayer of the metal precursor on the substrate, purging the reaction chamber to remove excess metal precursor and reaction by-products, and providing a pulse of an oxygen source to oxidize the metal precursor forming essentially a monolayer of metal oxide, and then purging the reaction chamber to remove the oxygen source and reaction by-products. These pulsing and purging steps may be repeated until a metal oxide film with a desired thickness is formed on the substrate. These embodiment methods form very thin and very uniform metal silicide layers on substrates in a well-controlled manner.

Some embodiments of the invention provide a method for forming dual metal silicide contacts, with a first type of silicide such as nickel silicide for p-type devices and a second type of silicide such as titanium silicide for n-type devices in a process flow that is compatible with high-volume semiconductor processing. Example substrates for NMOS transistors include p-type single crystal silicon, or carbon doped silicon. Example substrates for PMOS transistors include n-type single crystal silicon (Si), silicon germanium (SiGe), germanium (Ge), and germanium-tin (GeSn). Example n-type devices include NMOS transistors with arsenic and phosphorus doped single crystal or amorphous silicon, carbon doped silicon, silicon germanium, germanium, and germanium-tin source/drains, resistors, and capacitors as well as arsenic and phosphorus doped polycrystalline silicon, carbon doped silicon, germanium doped silicon (silicon germanium), germanium, and germanium-tin transistor gates, resistors, and capacitors. In some instances when source/drains are implanted with a heavy atom such as arsenic, argon, or indium the single crystal surface may be converted to an amorphous surface. Example p-type devices include PMOS transistors with B11 and $BF_2$ doped single crystal or amorphous silicon, carbon doped silicon, germanium doped silicon (silicon-germanium), germanium, and germanium-tin source/drains, resistors, and capacitors; and B11 and $BF_2$ doped polycrystalline silicon, carbon doped silicon, germanium doped silicon, silicon-germanium, germanium, and germanium-tin gates, resistors, and capacitors.

According to some embodiments, silicidation may be carried out on a planar surface or a non-planar surface. In some embodiments, silicidation may be carried out on one or more vertical surfaces, which may be part of a trench or a three-dimensional structure protruding upward from the surface of the substrate. Silicidation may be carried out on a three-dimensional surface or on a surface perpendicular to the substrate surface. Examples of three-dimensional devices include gates of finFET transistors and wrap around contact structures that provide large area metal-semiconductor contacts that lower the electrical resistance. Silicidation may also be carried out on non-uniform surfaces. A person skilled in the art would understand that the disclosed silicidation process may be carried out on various surfaces and structures within the scope of the present invention. For example, the substrate may contain multiple semiconductor device structures already formed with openings to contacts of n-type and p-type devices. The devices may be transistors or capacitors, where the transistors can include flash type devices. According to one embodiment, the devices can be all p-type devices. According to another embodiment, the devices can be all n-type devices.

Although the present disclosure makes reference to nickel oxide, elemental nickel, and nickel silicide, the present invention is also applicable to silicidation processes for any metal that is able to react with semiconductor substrates to form a metal-semiconductor compound such as silicide in case of silicon containing substrates and germanide in the case of germanium containing substrates. Examples of such metals include, Co, Os, Ru, Ir, Rh, Pd and Pt.

For purposes of illustration, the present disclosure uses titanium metal as an oxygen-scavenging, silicide-forming metal. Other oxygen-scavenging, silicide-forming metals such as Sc, Y, La and lanthanides, Zr, Hf, V, Nb, and Ta may also be used.

According to some embodiments, a metal oxide film is formed on a semiconductor substrate by a chemical vapor deposition (CVD) process or an atomic layer deposition (ALD) process. The CVD process can include simultaneously exposing the wafer to a gaseous metal precursor and a gaseous oxygen source. The ALD process can include multiple pulsing cycles, where each cycle comprises pulsing a vaporized metal precursor into the reaction chamber to form at most a molecular monolayer of the metal precursor on the substrate, purging the reaction chamber to remove excess metal precursor and reaction by-products, and then providing a pulse of an oxygen source onto the wafer to react with the metal precursor forming a metal oxide layer. The pulsing and purging steps may be repeated until a metal oxide film with a desired thickness has been formed on the substrate.

The substrate can, for example, be a 200 nm or a 300 nm Si, SiGe, Ge, GeSn, or InGaAs wafer. The wafer surface may have been patterned and may comprise structures such as nodes, vias, trenches, transistors, capacitors, FinFETs, or microelectromechanical systems (MEMS).

Techniques described herein form uniform metal silicide layers on planar and on non-planar semiconductor regions such as doped and undoped single crystal or amorphous silicon, doped or undoped single crystal or amorphous carbon doped silicon, doped or undoped single crystal or amorphous, doped and undoped single crystal or amorphous germanium doped silicon, doped and undoped single crystal or amorphous silicon germanium, doped and undoped single crystal or amorphous germanium, doped and undoped single crystal or amorphous germanium-tin, and doped and undoped polycrystalline silicon, polycrystalline carbon doped silicon, polycrystalline silicon carbide, polycrystalline silicon germanium, polycrystalline germanium, and polycrystalline germanium-tin.

Techniques described herein provide a method to form different silicides on n-type and p-type semiconductor regions such as NMOS and PMOS transistor source/drains and gates.

As can be appreciated, there are several benefits that embodiment techniques herein provide. A uniform metal silicide may be formed on nonplanar, three-dimensional structures such as finFET transistor gates and 3D transistor source/drains with wrap around contacts. In addition, different metal silicides with different work functions may be formed on n-type silicon and p-type silicon, carbon doped silicon, germanium doped silicon (silicon germanium), germanium, or germanium-tin to lower contact resistance.

An example embodiment using titanium as the oxygen-scavenging metal for illustration will now be described with reference to FIGS. 1A-1E and FIG. 2. FIGS. 1A-1E are cross sectional views illustrating the major steps in forming a metal silicide on a semiconductor region 102 according to embodiments. FIG. 2 is a flow diagram describing the steps in FIGS. 1A-1E. The semiconductor region 102 may be undoped or doped single crystalline silicon, carbon doped silicon, germanium doped silicon, silicon germanium, germanium, and germanium-tin; undoped or doped amorphous silicon, carbon doped silicon, silicon carbide, germanium doped silicon (silicon germanium), germanium, and germanium-tin, or undoped or doped polycrystalline silicon, carbon doped silicon, germanium doped silicon, silicon germanium, germanium, and germanium-tin.

Figure 2:
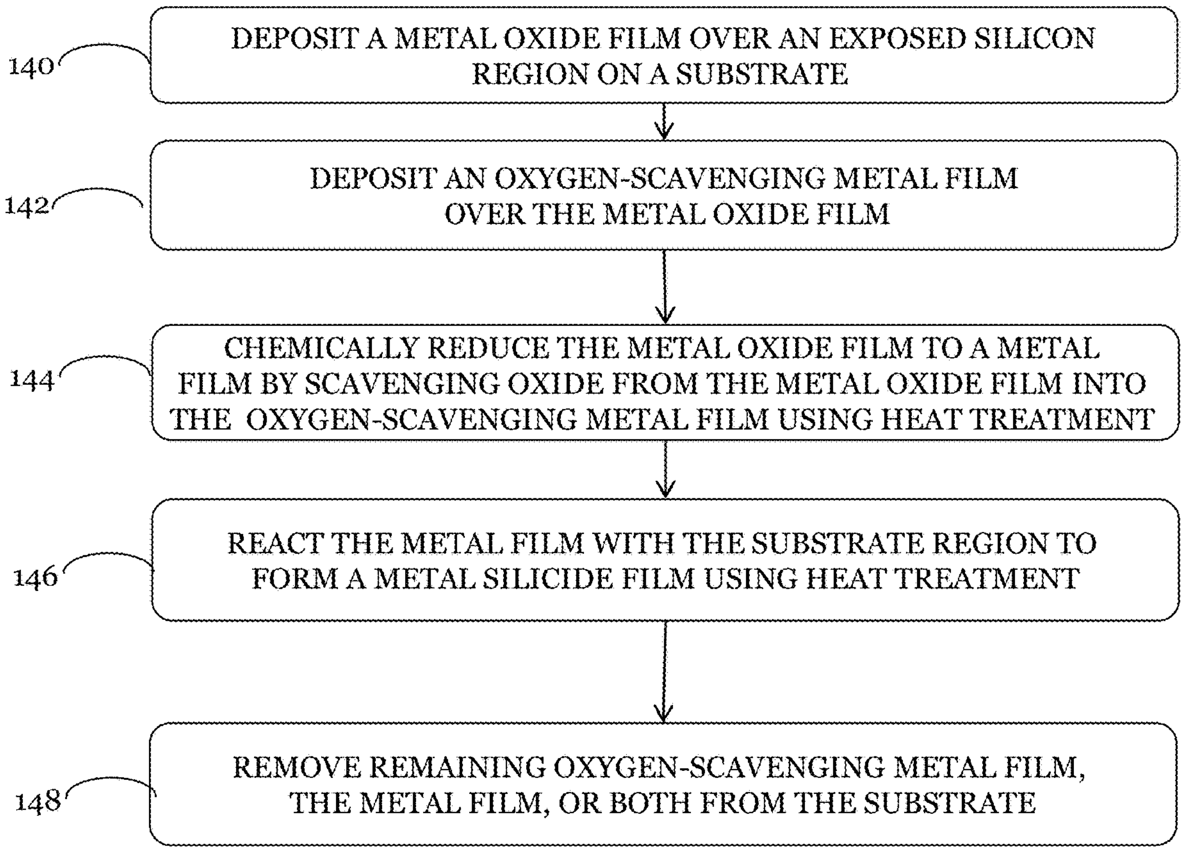
FIG. 2 is a flow diagram with blocks describing the cross sections in FIGS. 1A through 1E in accordance with embodiments.

Referring to block 140 in FIG. 2, and FIG. 1A, a metal oxide film 104 is deposited onto the semiconductor region 102. The metal in the metal oxide is a metal that forms a metal silicide when reacted with a semiconductor region 102.

Nickel silicide formation is used to illustrate embodiments. Accordingly, in one or more embodiments, the metal oxide film 104 comprises nickel oxide film. The metal oxide film 104 may be deposited by a CVD process or an ALD process, for example. Vapor deposition of the metal oxide film 104 ensures a uniform deposition thickness over surfaces including horizontal surfaces, vertical surfaces, and irregularly shaped surfaces. The metal oxide film 104 such as nickel oxide may be deposited using a metalorgano precursor. Example organonickel precursors may include betadiketonate compounds, nickel cyclopentadienyl compounds, nickel carbonyl compounds and combinations thereof. For example, the organonickel precursor may include nickel acetylacetonate, $Ni(acac)_2$, bis(2,2,6,6-tetramethylheptane-3,5-dionato)nickel, $Ni(thd)_2$, bis(cyclopentadienyl)nickel, $Ni(cp)_2$, or derivatives thereof. The source for the oxygen in the nickel oxide film may include water, ozone, oxygen plasma, oxygen radicals, or oxygen atoms. Depending upon the organonickel precursor, deposition temperatures may be between about 150° C. and 400° C. Using an ALD process the thickness of the nickel oxide film may be deposited uniformly and may be precisely controlled. A thickness of the metal oxide film 104 can, for example, about 10 nm or less. In one example, a thickness of the metal oxide film 104 such as nickel oxide film is between about 1 nm and about 2 nm.

Figure 1B:
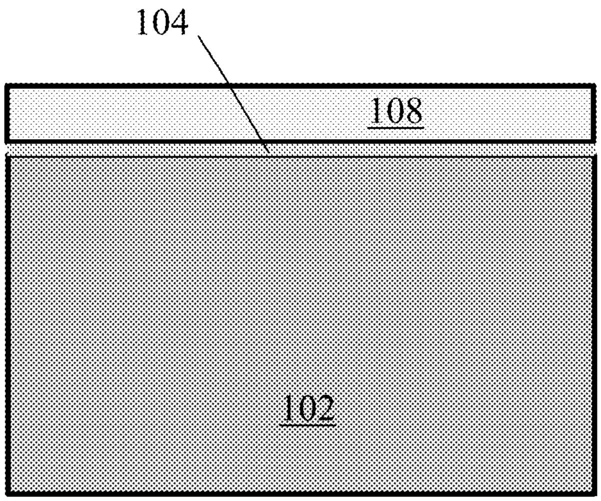

In block 142 in FIG. 2, illustrated in the cross section in FIG. 1B, a titanium metal film 108 is deposited on the metal oxide film 104. The titanium metal film 108 may be deposited by a plasma-enhanced CVD (PECVD) process or a plasma-enhanced ALD (PEALD) process. For example, the titanium metal film 108 may be deposited by PECVD using $TiCl_4$ gas and $H_2$ gas. In another example, the titanium metal film 108 may be deposited by CVD or PECVD using an organotitanium precursor. The thickness of the titanium metal film 108 may be about twice the thickness of the metal oxide film 104 or more. A thickness of the titanium metal film 108 may, for example, be less than about 20 nm. In one example, a thickness of the titanium metal film 108 may be between about 3 nm and 5 nm. Although not illustrated in FIG. 1B, during titanium metal film 108 deposition, titanium may scavenge oxygen from the metal oxide film 104 converting some portion or all of it to an elemental metal film 106. In an example, the elemental metal film 106 is a nickel metal film. At temperatures above about 200° C., the elemental metal film 106 may react with the semiconductor region 102 forming metal silicide compounds such as nickel silicide compounds. Crystalline nickel silicide formed at temperatures below about 450° C. has high resistance. Metal silicide 110 such as nickel silicide may be annealed at temperatures around 500° C. or more and converted to a lower resistance crystalline form.

Figure 1C:
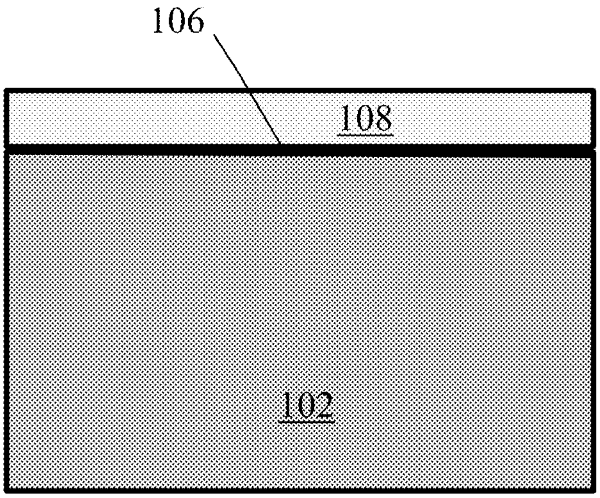

Referring to block 144 in FIG. 2, and the cross-sectional view in FIG. 1C, in an embodiment, during an annealing step, the titanium metal film 108 scavenges any remaining oxygen from the metal oxide film 104 such as nickel oxide film converting it to the elemental metal film 106 such elemental nickel film. The annealing step may be performed at temperatures in the range of 450° C. to 750° C. in an inert ambient. Additionally, the elemental metal film 106 may react with silicon in the underlying semiconductor region 102 forming metal silicide 110. Some interdiffusion between the elemental metal film 106 and the titanium metal film 108 may occur at the interface forming a thin layer of an elemental metal/titanium alloy, e.g., of a Ti/Ni alloy.

Figure 1D:
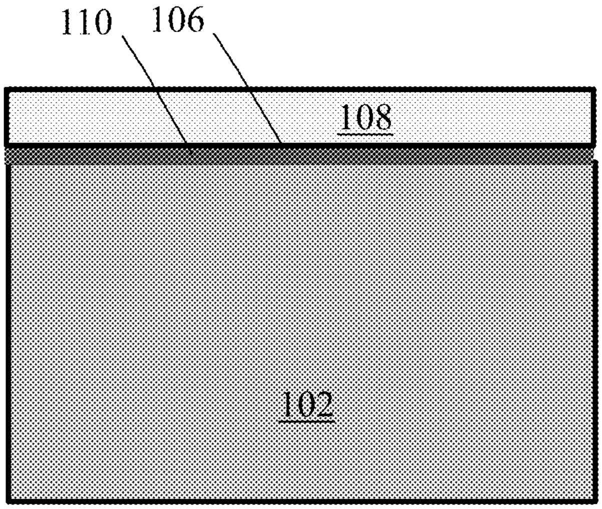

Block 146 in FIG. 2, and the cross-sectional view in FIG. 1D illustrates the elemental metal film 106 such as nickel metal film reacting with silicon in the underlying semiconductor region 102 to form a metal silicide 110 such as nickel silicide. The semiconductor region 102 may be single crystal silicon, amorphous silicon, or polycrystalline silicon; may be single crystal silicon carbide, amorphous silicon carbide, or polycrystalline silicon carbide; or may be single crystal carbon doped silicon, amorphous carbon doped silicon, or polycrystalline carbon doped silicon; or may be single crystal germanium doped silicon, amorphous germanium doped silicon, polycrystalline germanium doped silicon; or may be single crystal silicon germanium, amorphous silicon germanium, polycrystalline silicon germanium; or may be single crystal germanium, amorphous germanium, or polycrystalline germanium; or may be single crystal germanium-tin, amorphous germanium-tin, or polycrystalline germanium-tin. If the semiconductor region 102 is silicon dioxide or silicon nitride, and the metal is nickel, nickel silicide may be formed beginning at about 500° C.

Figure 1E:
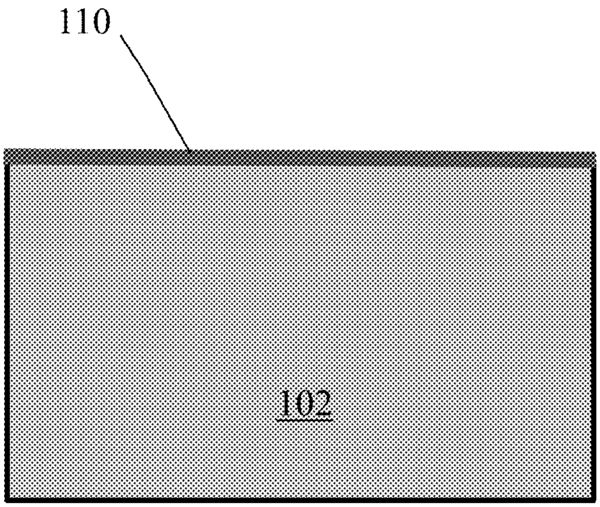

In block 148 in FIG. 2, illustrated in the cross-sectional view in FIG. 1E, unreacted titanium metal film 108 and unreacted elemental metal film 106 are removed. The unreacted metal films may be removed using an acid wet etch or using a plasma etch.

In an embodiment, the titanium metal film 108 is deposited using PECVD with precursor gases comprising $TiCl_4$ and $H_2$. Unreacted titanium metal and unreacted nickel are etched away with chlorine atoms by turning off the flow of hydrogen into the process chamber and using PECVD with $TiCl_4$ plasma. Biased sputtering with argon may be added to assist with etching of some metals such as nickel.

In an embodiment, the titanium metal film 108 is deposited and the metal silicide is formed at a temperature in the range of 450° C. to 750° C. Unreacted titanium metal film 108 and unreacted elemental metal film 106 are removed by etching with an acid solution.

In an embodiment the titanium metal film 108 is deposited using PECVD with precursor gases comprising $TiCl_4$ and $H_2$ at a temperature in the range of 450° C. to 750° C. Unreacted titanium metal film 108 and unreacted elemental metal film 106 are removed using PECVD with $TiCl_4$ and with the flow of $H_2$ turned off.

In an embodiment, the titanium metal film 108 is deposited and the metal silicide is formed at a temperature below about 450° C. When the elemental metal film 106 is nickel, the formed nickel silicide may have a high resistance crystalline form. After the unreacted titanium metal film 108 and unreacted elemental metal film 106 are removed, the metal silicide 110 is converted from a high resistance crystalline form to a low resistance crystalline form by annealing at a temperature above about 500° C.

Another example embodiment using titanium as the oxygen-scavenging metal for illustration will now be described with reference to FIGS. 3A-3F and FIG. 4. FIGS. 3A-3F are cross sectional views illustrating the major steps in forming a metal silicide on NMOS transistors 116 and titanium silicide on PMOS transistors 114 in a CMOS integrated circuit according to embodiments. FIG. 4 is a flow diagram describing the steps in FIGS. 3A-3F.

Figure 3A:
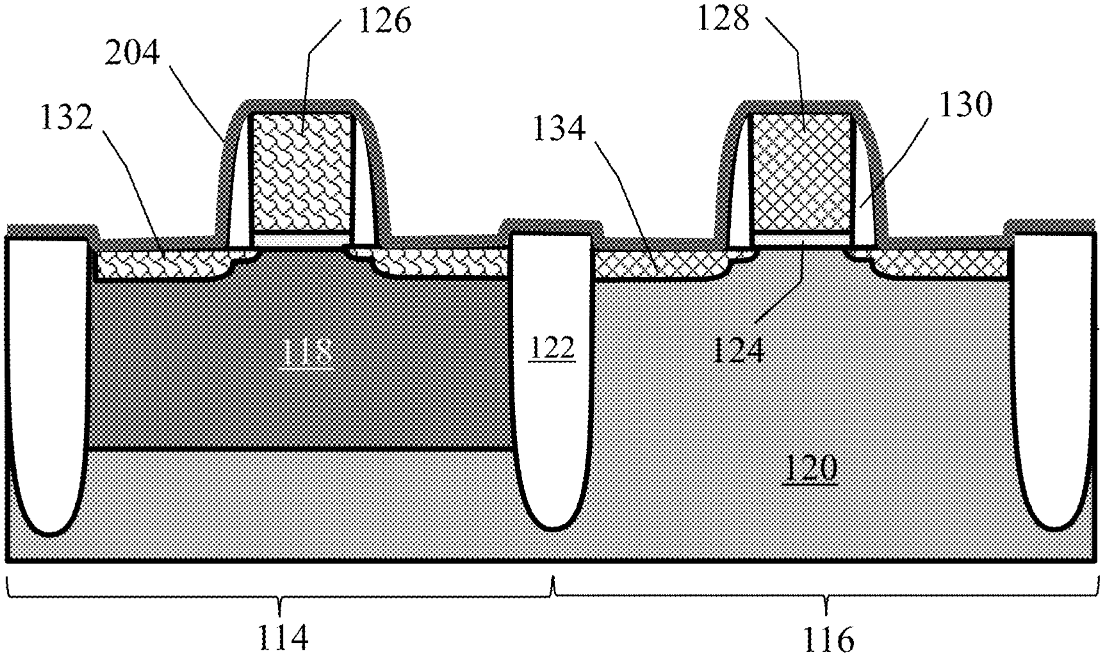
FIGS. 3A through 3G are cross sectional views of the major processing steps for formation of a first metal silicide film on PMOS transistors and titanium silicide on NMOS transistors in accordance with embodiments.
Figure 4:
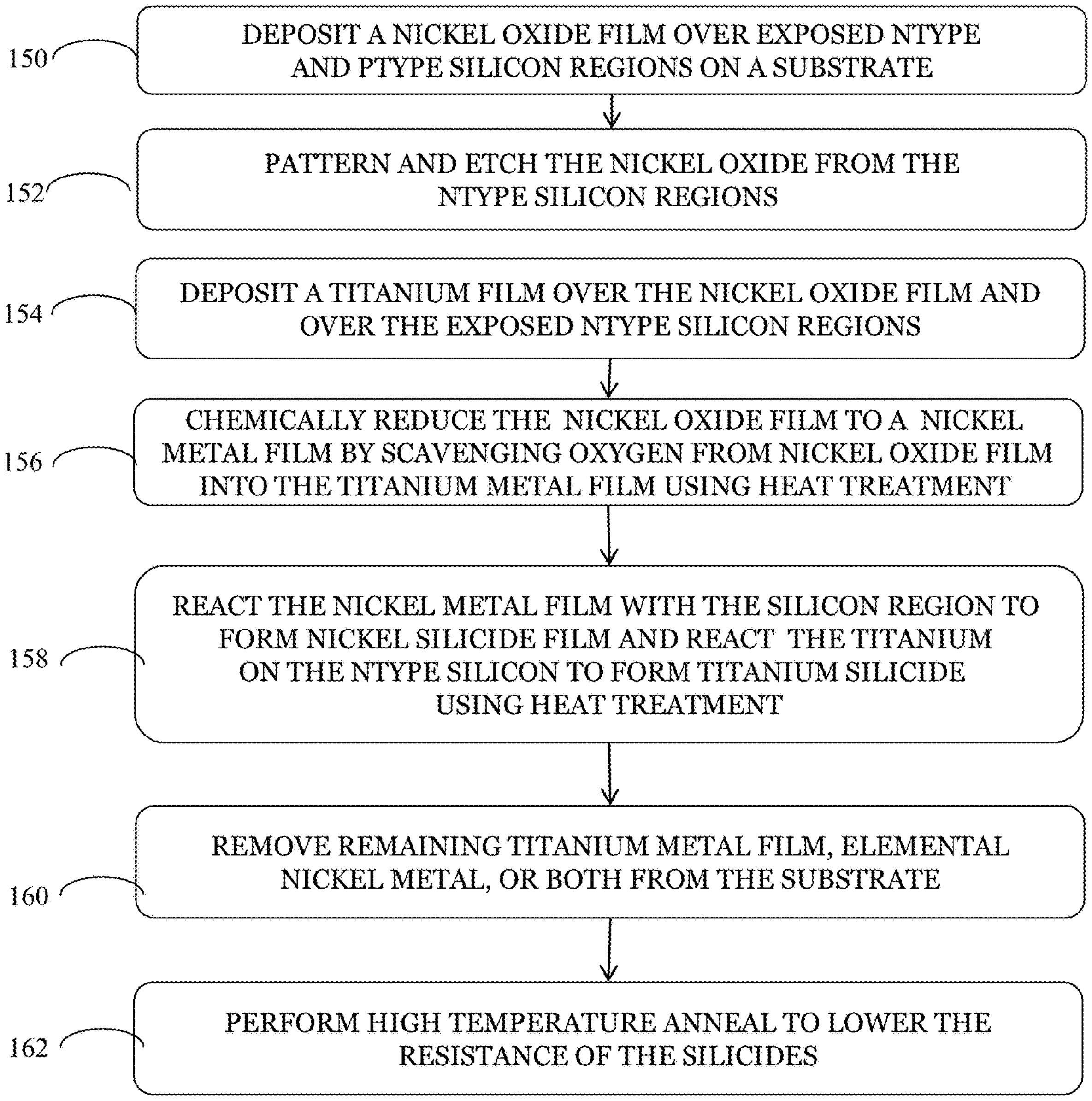
FIG. 4 is a flow diagram with blocks describing the cross sections in FIGS. 3A through 3G in accordance with embodiments.

The semiconductor substrates in the cross-section in FIGS. 3A, are n-type single crystal PWELL semiconductor substrate for the NMOS transistor body 120 and n-type polycrystalline semiconductor substrate for the NMOS transistor gate 128, p-type single crystal NWELL semiconductor substrate for the PMOS transistor body 118 and p-type polycrystalline semiconductor substrate for the PMOS transistor gate 126. These semiconductor substrates may be silicon, carbon doped silicon, germanium doped silicon (silicon-germanium), germanium, and germanium-tin. To illustrate the embodiments, a single crystal silicon, or carbon doped silicon substrate is used to illustrate NMOS transistors and a single crystal silicon, germanium doped silicon (silicon germanium) substrate is used to illustrate PMOS transistors. A gate dielectric 124 such as silicon dioxide, silicon oxynitride, or a high-k dielectric such as hafnium oxide forms a capacitor between the transistor gates, 126 and 128, and the underlying PMOS transistor body 118 and NMOS transistor body 120. Source/drains 132 on the PMOS transistor 114 are implanted self-aligned to dielectric sidewall spacers 130 on the PMOS transistor gate 126. Source/drains 134 on the NMOS transistor 116 are implanted self-aligned to the dielectric sidewall spacers 130 on the NMOS transistor gate 128.

To provide the lowest possible contact resistance on CMOS circuits, it is advantageous to form nickel silicide on PMOS transistors 114 and to form titanium silicide on NMOS transistors 120 as described in embodiments.

Referring to block 150 in FIG. 4, and FIG. 3A, a metal oxide film such as a nickel oxide film 204 is deposited over the NMOS transistor 116 and PMOS transistor 114 in FIG. 3A. The metal oxide film is deposited on semiconductor substrates such as the PMOS transistor 114 source/drain 132 and PMOS transistor gate 126 and the NMOS transistor source/drain 134 and NMOS transistor gate 128. The metal oxide film is also deposited over shallow trench isolation dielectric 122 and dielectric sidewall spacer 130.

Nickel silicide formation is used to illustrate embodiments although other silicide forming metals such as Co, Os, Ru, Jr, Rh, Pd and Pt may also be used. The nickel oxide film 204 may be deposited by a CVD process or an ALD process, using an organonickel precursor as previously described. Depending upon the organonickel precursor, deposition temperatures may be between about 200° C. and 400° C. Using an ALD process, as described previously, the thickness of the nickel oxide film may be deposited uniformly and may be precisely controlled even over 3D and irregular surfaces. A thickness of the nickel oxide film can, for example, be about 10 nm or less. In one example, a thickness of the nickel oxide film is between about 1 nm and 2 nm.

Figure 3B:
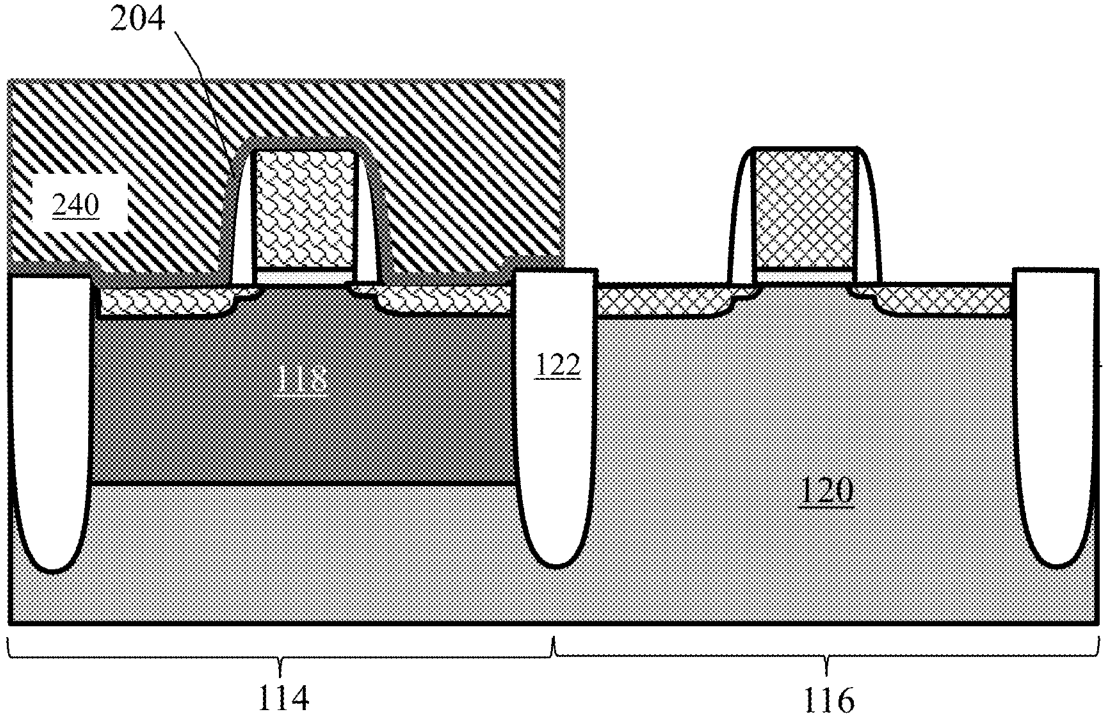

In block 152 in FIG. 4 and illustrated in cross-sectional view in FIG. 3B, a photoresist pattern 240 is formed over the PMOS transistor 114 area. The nickel oxide film 204 is removed from the NMOS transistor 116 area using a wet etch or a plasma etch.

Figure 3C:
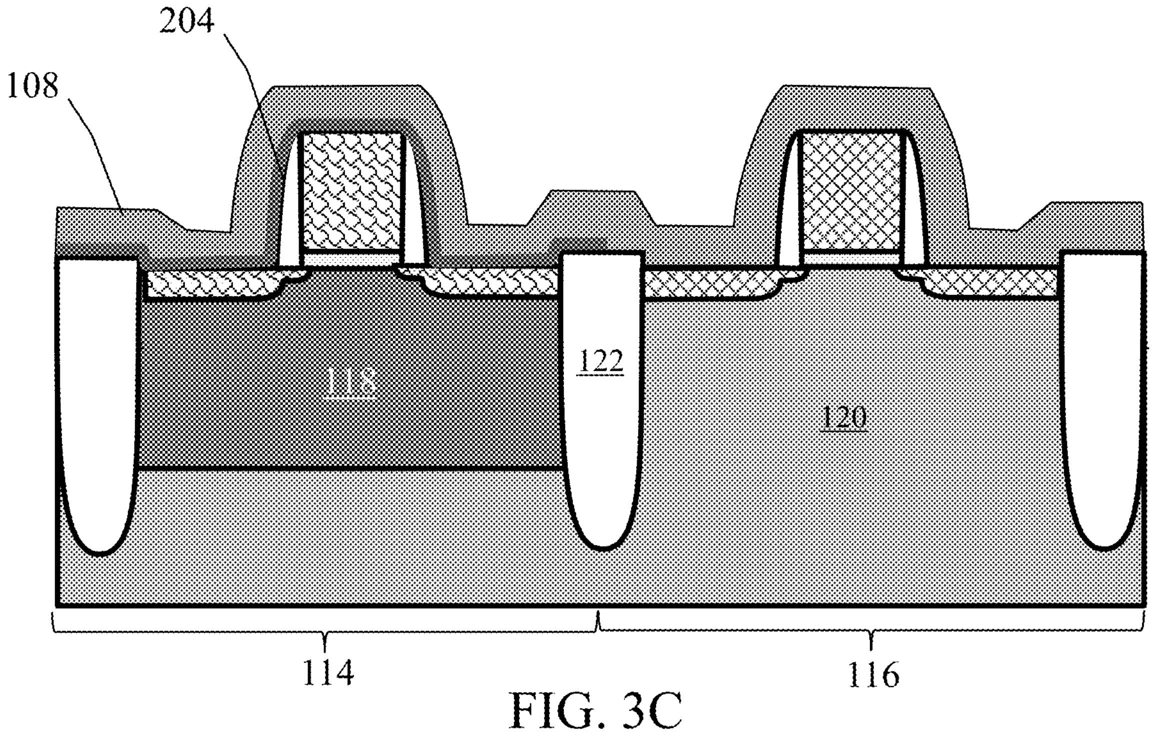
Figure 3D:
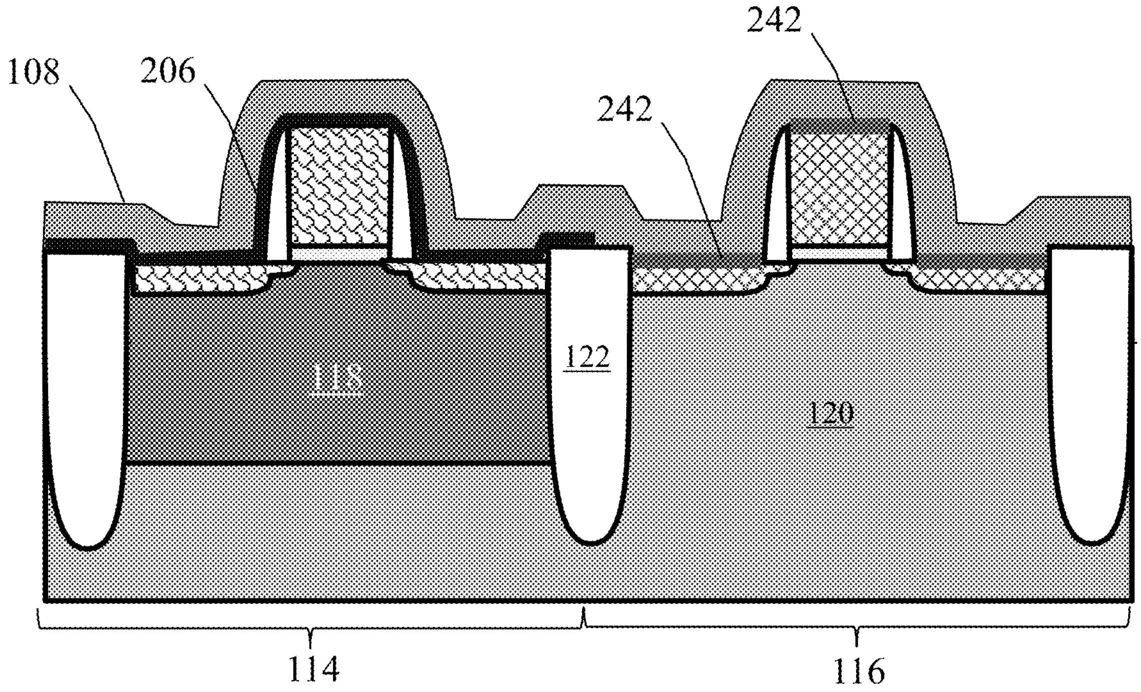

In block 154 in FIG. 4, illustrated in the cross-section in FIG. 3D, the photoresist pattern 240 is removed and a titanium metal film 108 is deposited over the PMOS transistor 114 and also deposited over the NMOS transistor 116.

The titanium metal film 108 may be deposited using vapor deposition processes as described previously. The titanium metal film 108 may be deposited at a temperature less than about 450° C. to prevent nickel silicide from forming on the dielectric sidewall spacer 130 or on the STI dielectric 122 and shorting transistors together. The thickness of the titanium metal film 108 may be about twice the thickness of the nickel oxide film 204 or more. A thickness of the titanium metal film 108 may, for example, be less than about 20 nm. In one example, a thickness of the titanium metal film 108 is between about 3 nm and 5 nm. Although not shown in FIG. 3D, during the deposition of the titanium metal film 108 with temperatures up to about 450° C. the depositing titanium may react with the exposed semiconductor substrate such as doped single crystal and amorphous silicon or doped single crystal and amorphous silicon germanium forming a high resistance crystalline form of titanium silicide 242. Although not shown in FIG. 3D, during deposition, the titanium metal film 108 may scavenge oxygen from a portion of nickel oxide film 204 converting it to nickel metal film 206. Nickel metal film 208 in contact with a semiconductor substrate such as single crystal and amorphous silicon, single crystal and amorphous carbon doped silicon, single crystal and amorphous germanium doped silicon, and single crystal and amorphous silicon germanium may react to form a high resistance form of nickel silicide 244 at temperatures between about 200° C. and 450° C.

Figure 3E:
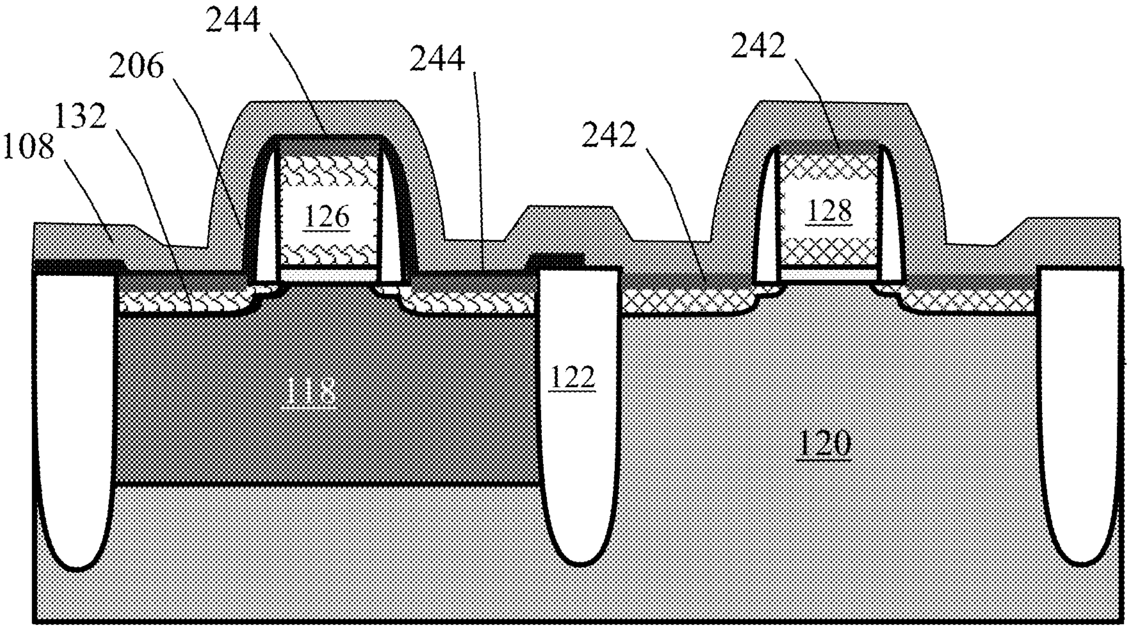

Referring to block 156 in FIG. 4, and the cross-sectional view in FIG. 3E, during an annealing step, the titanium metal film 108 may scavenge oxygen from the nickel oxide film 204 converting it to a nickel metal film 206. The annealing step may be performed at temperatures up to about 450° C. in an inert ambient to avoid forming nickel silicide on the dielectric sidewall spacers 130 and on the STI dielectric 122. The nickel metal film 206 may react with silicon in the PMOS transistor 114, PMOS transistor source/drain 132 and PMOS transistor gate 126 to form nickel silicide 244. Additional titanium silicide 242 may form on the NMOS transistor source/drains 134 and on the NMOS transistor gate 128 during the anneal. Some interdiffusion between the nickel metal film 206 and the titanium metal film 108 may occur resulting in a thin layer of a Ti/Ni alloy at the interface.

Although blocks 154, 156, and 158 in FIG. 4 are described as separate process steps, the reactions in these blocks 154, 156, 158 may occur simultaneously, especially when the titanium metal film 108 deposition temperature is near 450° C.

Figure 3F:
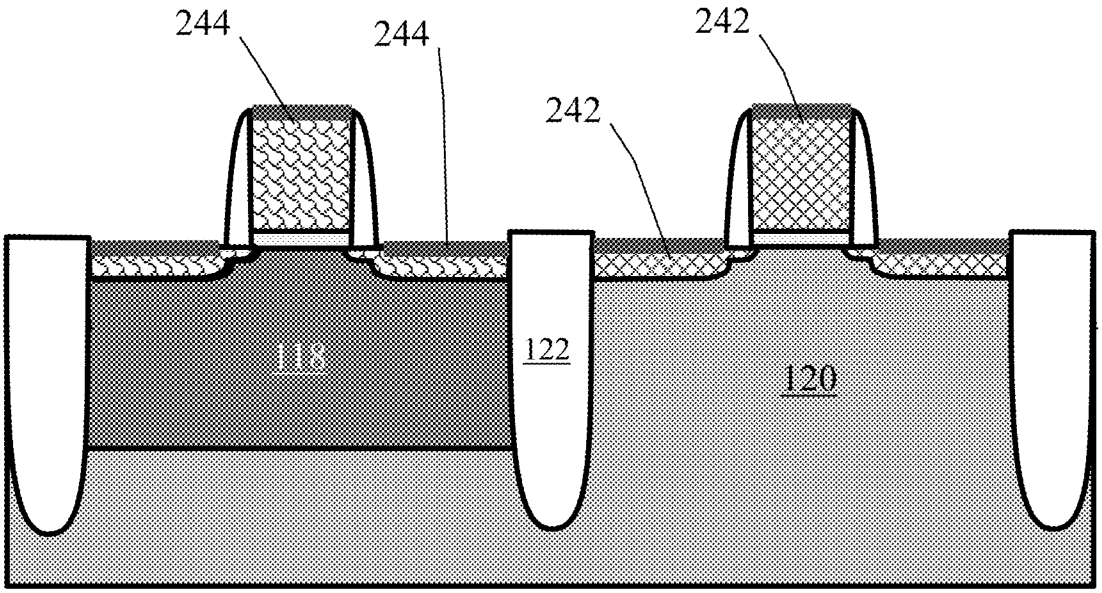

In block 160 in FIG. 4, and the cross-sectional view in FIG. 3F, unreacted titanium metal film 108 and unreacted nickel metal film 206 are removed by etching. The etching may be a wet etch in an acid or may be a plasma etch. Fluorine and chlorine plasma etches may be employed. A biased sputtering component with argon may be added to facilitate nickel metal etching.

In block 162 in FIG. 4, illustrated in the cross-sectional view in FIG. 3F, a high temperature anneal may be performed to convert high resistance crystalline form of nickel silicide 244 to a low resistance crystalline form of nickel silicide 248 and to convert high resistance crystalline form of titanium silicide 242 to a low resistance crystalline form of titanium silicide 246. For example, a higher resistance nickel silicide 244 with a resistivity of about 24 micro-ohm*cm may be annealed to a lower resistance nickel silicide 248 with a resistivity of about 10.5 micro-ohm*cm. A higher resistance titanium silicide 242 with a resistivity of about 100 micro-ohm*cm may be annealed to a lower resistance titanium silicide 246 with a resistivity of about 15 micro-ohm*cm.

Forming nickel silicide on PMOS transistors and titanium silicide on NMOS transistors improves the performance of CMOS integrated circuits by reducing overall contact resistance.

Nickel silicide on PMOS transistors and titanium silicide on NMOS transistors are used to illustrate embodiments. Other silicide-forming, oxygen-scavenging metals similar to titanium including Sc, Y, La, lanthanides, Zr, Hf, V, Nb, and Ta may be used. Other silicide-forming, oxide forming metals similar to nickel including Co, Ru, Os, Rh, Ir, Pd, and Pt may be used.

Figure 5:
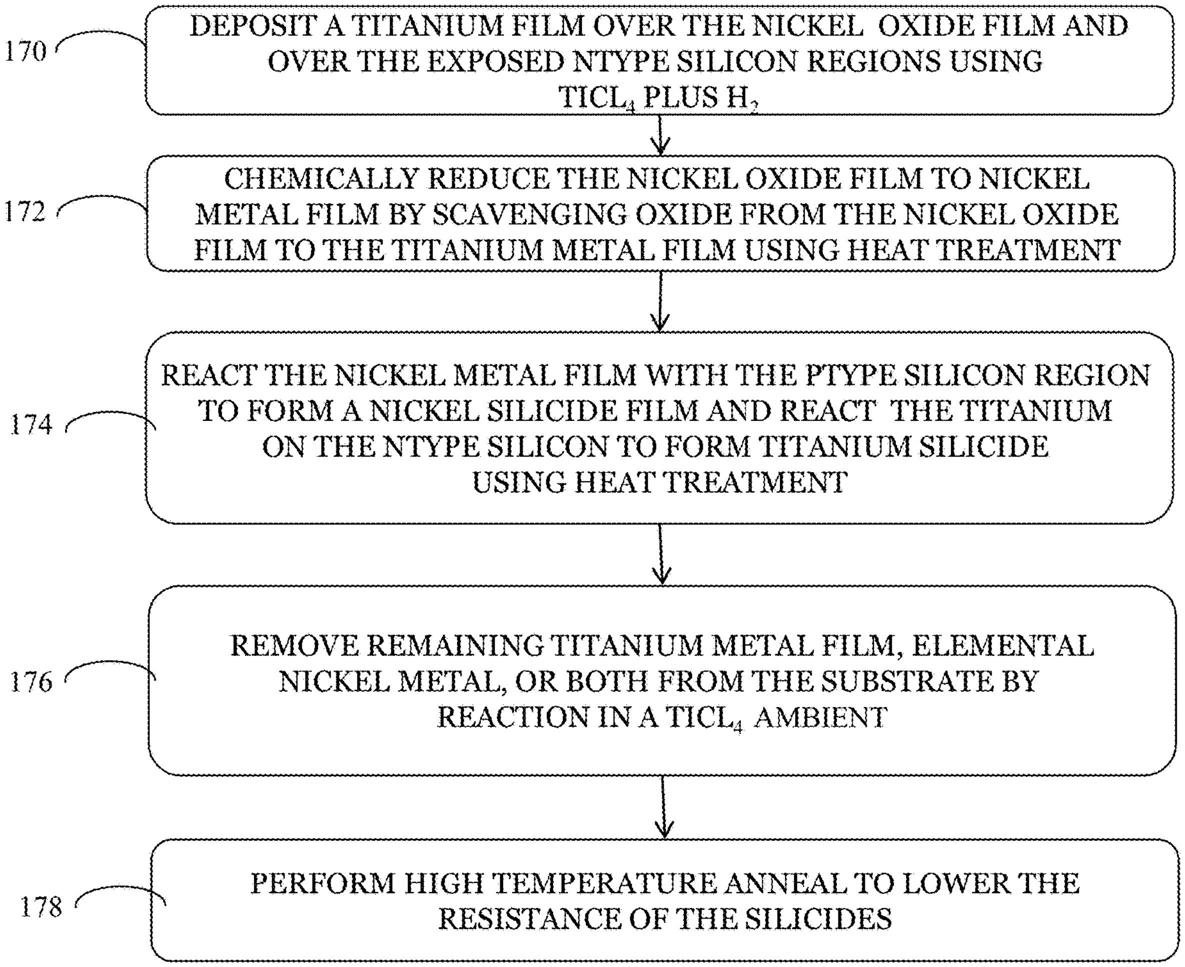
FIG. 5 is a flow diagram with blocks describing the cross sections in FIGS. 3D through 3G in accordance with embodiments.

An embodiment method in which titanium metal film deposition, metal silicide formation, titanium silicide formation, unreacted titanium and unreacted metal removal, and low resistivity anneal are performed in the same reaction chamber is described blocks 170 through 178 in FIG. 5 and cross-sectional FIGS. 3C through 3F. Although other silicide forming metals may be used, nickel is used to illustrate these embodiments. After a nickel oxide film is selectively formed on PMOS transistors, the semiconductor substrate is loaded into a reaction chamber with PECVD and anneal capability. Titanium metal film 108 is deposited over the PMOS and NMOS transistors 114 and 116 using PECVD with a plasma formed with precursor gases containing $TiCl_4$ and $H_2$. An anneal is performed converting the nickel oxide film 204 to nickel metal film 206 and forming nickel silicide 244 on the PMOS transistor source/drains 132 and PMOS transistor gate 126. During the titanium deposition, titanium silicide 242 is formed on the NMOS transistor source/drains 134 and NMOS transistor gate 128. The $H_2$ is turned off and unreacted titanium metal and unreacted nickel metal are removed. A high temperature anneal is performed to convert the nickel silicide 244 and titanium silicide 242 to lower resistance crystalline forms. The NMOS transistor source/drains may be a semiconductor single crystal or amorphous material such as silicon or carbon doped silicon. The PMOS transistor source/drains may be a single crystal or amorphous material such as silicon, germanium doped silicon (silicon germanium). In advanced CMOS devices NMOS transistor source/drains are typically carbon doped silicon and PMOS transistor source/drains are typically germanium doped silicon (silicon germanium).

In block 170 in FIG. 5 and illustrated in the cross section in FIG. 3C, a titanium metal film 108 is deposited over the PMOS and NMOS transistors 114 and 116. The titanium metal film 108 may be deposited using $TiCl_4$ and $H_2$ in a plasma enhanced chemical vapor deposition (PECVD) process at a temperature between about 400° C. and 450 C.

In block 172 in FIG. 5 and illustrated in the cross section in FIG. 3D, titanium metal film 108 deposition in this temperature range may scavenge oxygen from the nickel oxide film 204 converting it to a nickel metal film 206. Titanium metal film 108 deposition in this temperature range may also form high resistivity titanium silicide 242 on the NMOS transistor source/drains 134 and the NMOS transistor gate 128.

In block 174 in FIG. 5 and illustrated in the cross section in FIG. 3E, at these deposition temperatures, nickel metal film 206 may react to form a high resistivity nickel silicide on the PMOS transistor source/drains 132 and the PMOS transistor gate 126.

Although blocks 170, 172, and 174 in FIG. 5 are described as separate process steps, the reactions in these blocks 170, 172, 174 may occur simultaneously during the titanium metal film 108 deposition.

In block 176 in FIG. 5, and the cross-sectional view in FIG. 3F, unreacted titanium metal film 108 and unreacted nickel metal film 206 are removed by etching with chlorine in a PECVD plasma etch using $TiCl_4$ and an inert carrier gas such as argon. This may be performed in the same reaction chamber as the titanium deposition by turning off the flow of $H_2$ and allowing the $TiCl_4$ to continue flowing. A biased sputter etch with argon ions may be added to assist in removing the nickel metal.

Figure 3G:
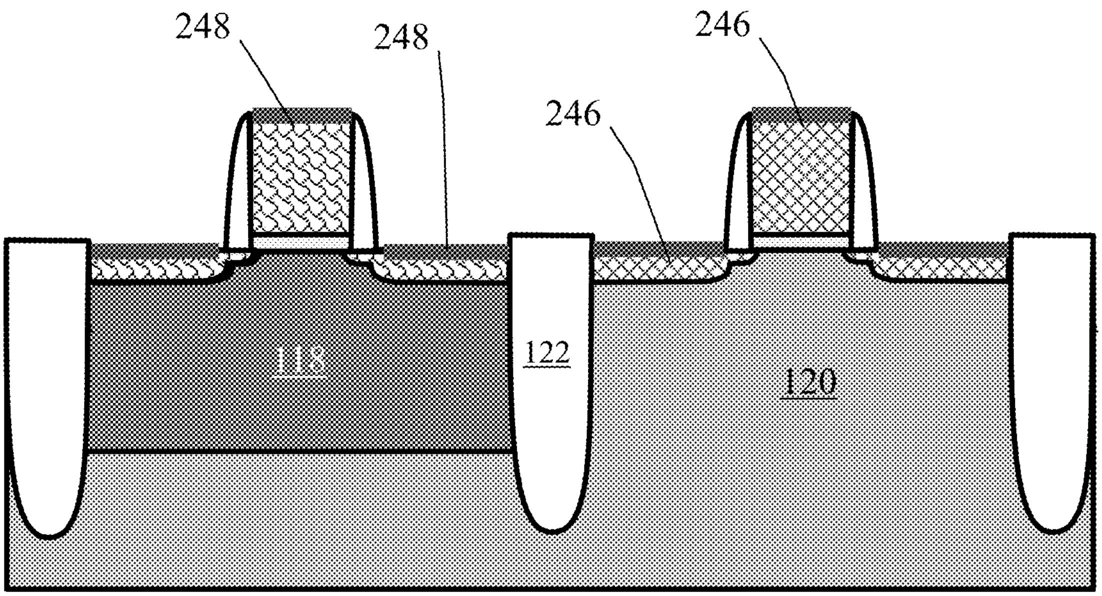

In block 178 in FIG. 5, illustrated in the cross-sectional view in FIG. 3G, a high temperature anneal in between about 500° C. and 750° C. may be performed to convert high resistance crystalline form of nickel silicide 244 to a low resistance crystalline form of nickel silicide 248 and to convert high resistance crystalline form of titanium silicide 242 to a low resistance crystalline form of titanium silicide 246. This anneal may be performed in the same reaction chamber as the titanium metal deposition and unreacted metal removal steps.

This embodiment method in which titanium deposition, silicide formation, unreacted metal removal, and anneal are performed within the same chamber, reduces the number of manufacturing tools required, eliminates the time required to transfer wafers between tools, and eliminates a number of pump-down and return to atmospheric pressure cycles. Increased profitability may be realized from the reduced tool cost and reduced cycle time.

In embodiment methods, deposited Ti, Sc, Y, La, lanthanides, Zr, Hf, V, Nb, or Ta metal scavenges oxygen from a metal oxide film converting it to an elemental metal film that then reacts with a semiconductor region to form a metal silicide.

In embodiment methods, deposited titanium metal scavenges oxygen from a metal oxide film converting it to an elemental metal film that then reacts with a semiconductor region to form a metal silicide.

In various embodiment methods, deposited titanium metal scavenges oxygen from a nickel oxide, cobalt oxide, ruthenium oxide, osmium oxide, rhenium oxide, or iridium oxide film.

In embodiment methods, deposited titanium metal scavenges oxygen from nickel oxide film converting it to nickel metal film that reacts with a semiconductor region to form nickel silicide.

In embodiment methods, deposited titanium metal scavenges oxygen from a metal oxide film converting it to a metal film that reacts with a semiconductor region on a PMOS transistor to form a metal silicide and the deposited titanium metal reacts with a semiconductor region on an NMOS transistor to form titanium silicide.

In embodiment methods, deposited titanium metal scavenges oxygen from a nickel oxide film converting it to a nickel metal film that reacts with a semiconductor region on a PMOS transistor to form nickel silicide and the deposited titanium metal reacts with the semiconductor region on an NMOS transistor to form titanium silicide.

In embodiment methods, deposited titanium scavenges oxygen from nickel oxide film converting it to an elemental nickel film that reacts with a semiconductor region to form a high resistivity nickel silicide on PMOS transistor source/drains and PMOS gates and the deposited titanium metal also reacts with a semiconductor region to form a high resistivity titanium silicide on NMOS source/drains and NMOS gates at a first temperature, unreacted titanium metal and unreacted nickel metal are removed, and the high resistivity nickel silicide and the high resistivity titanium silicide are converted to low resistivity nickel and low resistivity titanium silicide at a second temperature that is higher than the first temperature.

In embodiment methods, deposited titanium scavenges oxygen from nickel oxide film converting it to an elemental nickel film that reacts with a semiconductor region to form a high resistivity nickel silicide on PMOS transistor source/drains and PMOS gates and the deposited titanium metal reacts with a semiconductor region to form a high resistivity titanium silicide on NMOS source/drains and NMOS gates at a first temperature, unreacted titanium metal and unreacted nickel metal are removed, and the high resistivity nickel silicide and the high resistivity titanium silicide are converted to low resistivity nickel and low resistivity titanium silicides at a second temperature that is higher than the first temperature.

In embodiment methods, a metal silicide film is formed by depositing a metal oxide film on a semiconductor region using ALD or CVD, depositing a titanium metal film on the metal oxide film using PECVD, annealing to convert the metal oxide film to a metal film, reacting the metal film with the semiconductor region to form the metal silicide, and etching away unreacted titanium metal and unreacted metal.

In embodiment methods, a nickel silicide film is formed by depositing nickel oxide film on a semiconductor region using ALD or CVD, depositing a titanium metal film on the metal oxide film using PECVD with $TiCl_4$ and $H_2$, annealing the nickel oxide film and converting it to a nickel metal film, reacting the nickel metal film with the semiconductor region to form nickel silicide, and etching away unreacted titanium metal and unreacted nickel metal using Cl atoms generated in a PECVD $TiCl_4$ plasma.

In embodiment methods, a nickel silicide film is formed by depositing nickel oxide film on a semiconductor region using ALD or CVD, depositing a titanium metal film on the metal oxide film using PECVD with $TiCl_4$ and $H_2$ at a first temperature, converting the metal oxide film to a metal film at the first temperature, reacting the metal film with the semiconductor region to form a high resistivity nickel silicide film at the first temperature, etching away unreacted titanium metal and unreacted nickel metal in a $TiCl_4$ PECVD plasma, and annealing at a second temperature that is higher than the first temperature and converting the high resistivity nickel silicide to low resistivity nickel silicide.

In embodiment methods, forming nickel silicide film on PMOS transistors and forming titanium silicide on NMOS transistors by selectively forming nickel oxide film on the PMOS transistors, depositing a titanium metal film on the PMOS and NMOS transistors using PECVD with $TiCl_4$ and $H_2$, at a first temperature, forming high resistivity titanium silicide on the NMOS transistor source/drains and NMOS gates, converting the nickel oxide film to nickel metal film, forming a high resistivity nickel silicide on the PMOS source/drains and PMOS gates, etching away unreacted titanium metal and unreacted nickel metal in a $TiCl_4$ PECVD plasma, and annealing at a second temperature that is higher than the first temperature converting the high resistivity nickel silicide and titanium silicide to low resistivity nickel silicide and low resistivity titanium silicide.

In embodiment methods, within the same reaction chamber, titanium metal is deposited, silicide reactions are performed, unreacted metals are removed, and a resistance lowering anneal are performed.

Example embodiments of the present invention are summarized here. Other example embodiments can also be understood from the entirety of the specification and the claims filed herein.

Example 1. A method of forming a device, the method including providing a substrate containing an exposed semiconductor region, forming a metal oxide film over the exposed semiconductor region, and forming an oxygen-scavenging metal film over the metal oxide film. The method includes chemically reducing the metal oxide film to an elemental metal film by scavenging oxygen from the metal oxide film into the oxygen-scavenging metal film; and reacting the elemental metal film with the semiconductor region to form a metal-semiconductor layer, the metal-semiconductor layer forming a source/drain contact region of a transistor.

Example 2. The method of example 1, where the oxygen-scavenging metal film is a titanium metal film further including forming the titanium metal film by reacting TiCl4 with hydrogen and removing unreacted titanium film by etching in a TiCl4 ambient.

Example 3. The method of one of examples 1 or 2, where the semiconductor region includes silicon, carbon doped silicon, gallium, or gallium-tin.

Example 4. The method of one of examples 1 to 3, where the chemically reducing step and the reacting step are performed simultaneously using a heat-treating step.

Example 5. The method of one of examples 1 to 4, where the heat-treating step is performed at a substrate temperature between about 400° C. and about 750° C.

Example 6. The method of one of examples 1 to 5, where the chemically reducing step and the reacting step include a plurality of heat-treating steps.

Example 7. The method of one of examples 1 to 6, where the plurality of heat-treating steps include a first heat-treating step at a first substrate temperature and a second heat-treating step at a second substrate temperature that is greater than the first substrate temperature.

Example 8. The method of one of examples 1 to 7, where the exposed semiconductor region is a part of a transistor.

Example 9. The method of one of examples 1 to 8, where the metal in the metal film, in the metal oxide film, and in the metal-semiconductor layer is a metal selected from a group consisting of Ni, Os, Co, Ru, Ir, Pd, Pt, and Rh.

Example 10. The method of one of examples 1 to 9, where the metal oxide film includes a nickel oxide film, the metal film includes elemental nickel metal, and the metal-semiconductor layer includes a nickel silicide.

Example 11. The method of one of examples 1 to 10, further includes removing any remaining titanium metal film, elemental nickel metal, or both, from the substrate.

Example 12. The method of one of examples 1 to 11, where the oxygen-scavenging metal is a metal selected from a group consisting of Ti, Sc, Y, La and lanthanides, Zr, Hf, V, Nb, and Ta.

Example 13. A method of forming source/drain regions includes providing a substrate containing first and second semiconductor regions, selectively forming a metal oxide film over the first semiconductor region, and forming an oxygen-scavenging metal film over the first and second semiconductor regions. The method includes chemically reducing the metal oxide film to an elemental metal film by scavenging oxygen from the metal oxide film into the oxygen-scavenging metal film. The method includes reacting the elemental metal film with the first semiconductor region to form a metal semiconductor film, and reacting the oxygen-scavenging metal film with the second semiconductor region to form an oxygen-scavenging metal semiconductor film.

Example 14. The method of example 13, where the oxygen-scavenging metal film is a titanium metal film further including forming the titanium metal film by reacting TiCl4 with H2 and removing unreacted titanium film by etching in a TiCl4 ambient.

Example 15. The method of one of examples 13 or 14, where the chemically reducing step and the reacting the elemental metal film and the oxygen-scavenging metal film steps are performed simultaneously by heating the substrate.

Example 16. The method of one of examples 13 to 15, where the chemically reducing step and the reacting the elemental metal film and the oxygen-scavenging metal film steps include a plurality of heat-treating steps.

Example 17. The method of one of examples 13 to 16, where the plurality of heat-treating steps include a first heat-treating step at a first substrate temperature and a second heat-treating step at a second substrate temperature that is greater than the first substrate temperature.

Example 18. The method of one of examples 13 to 17, where the metal in the elemental metal film, in the metal oxide film, and in the metal semiconductor film is a metal selected from a group consisting of Ni, Os, Co, Ru, Ir, Pd, Pt and Rh.

Example 19. The method of one of examples 13 to 18, where the oxygen-scavenging metal is a metal selected from a group consisting of Ti, Sc, Y, La and lanthanides, Zr, Hf, V, Nb, and Ta.

Example 20. The method of one of examples 13 to 19, where the metal oxide film includes a nickel oxide film, the elemental metal film includes elemental nickel metal, and the metal semiconductor film includes nickel silicide.

Example 21. The method of one of examples 13 to 20, further including removing any remaining titanium metal film, elemental nickel metal, or both, from the substrate.

Example 22. The method of one of examples 13 to 21, where the first and second semiconductor regions are parts of transistors.

Example 23. The method of one of examples 13 to 22 where the first semiconductor region is p-type silicon or p-type silicon germanium and where the second semiconductor region is n-type silicon or n-type silicon germanium or n-type carbon doped silicon.

Example 24. The method of one of examples 13 to 23, where the first and second semiconductor regions are a part of nodes, vias, trenches, transistors, capacitors, FinFETs, or microelectromechanical systems (MEMS).

Example 32. The method of one of examples 13 to 31, where selectively forming the metal oxide film over the first semiconductor region includes forming the metal oxide film over the first and the second semiconductor regions and removing the metal oxide film from the second semiconductor regions by masking the first semiconductor region and removing the metal oxide from the second semiconductor region using an etching process.

Example 25. A method of forming a device includes providing a substrate containing first and second semiconductor regions, selectively forming a nickel oxide film over the first semiconductor region, and forming a titanium metal film over the first and second semiconductor regions. The method includes chemically reducing the nickel oxide film to an elemental nickel metal film by oxygen scavenging from the nickel oxide film to the titanium metal film. The method includes reacting the elemental nickel metal film with the first semiconductor region to form a nickel semiconductor film; and reacting the titanium metal film with the second semiconductor region to form a titanium semiconductor film, where the chemically reducing step and the reacting steps include a heat-treating step.

Example 26. The method of example 25, further including forming the titanium metal film by reacting TiCl4 with H2 and removing unreacted titanium film by etching in a TiCl4 ambient.

Example 27. The method of one of examples 25 or 26, where the heat-treating step includes a first heat-treating step at a first substrate temperature and a second heat-treating step at a second substrate temperature that is greater than the first substrate temperature.

Example 28. The method of one of examples 25 to 27, where the first and second semiconductor regions are parts of transistors.

Example 29. The method of one of examples 25 to 28, where the first semiconductor region is p-type silicon, p-type germanium doped silicon (SiGe), p-type germanium, or p-type germanium-tin and where the second semiconductor region is n-type silicon, n-type carbon doped silicon, or n-type germanium.

Example 30. The method of one of examples 25 to 29, where the first and second semiconductor regions are a part of nodes, vias, trenches, transistors, capacitors, FinFETs, or microelectromechanical systems (MEMS).

Example 31. The method of one of examples 25 to 30, further includes removing any remaining titanium metal film, elemental nickel metal, or both, from the substrate.

Example 31. The method of one of examples 25 to 31, where selectively forming the metal oxide film over the first semiconductor region includes forming the metal oxide film over the first and the second semiconductor regions and removing the metal oxide film from the second semiconductor regions by masking the first semiconductor region and removing the metal oxide from the second semiconductor region using an etching process.

In the preceding description, specific details have been set forth, such as particular processes and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of forming a device, the method comprising:
providing a substrate containing an exposed semiconductor region;
forming a nickel oxide film over the exposed semiconductor region;
forming an oxygen-scavenging metal film over the nickel oxide film;
chemically reducing the nickel oxide film to an elemental nickel film by scavenging oxygen from the nickel oxide film into the oxygen-scavenging metal film;
reacting, at a first temperature, the elemental nickel film with the exposed semiconductor region to form an intermediate layer containing atoms from the elemental nickel film and atoms from the exposed semiconductor region, the intermediate layer having a first resistivity of 24 micro-ohm*cm;
removing remaining portions of the elemental nickel film and the oxygen-scavenging metal film after forming the intermediate layer; and
after the removing, annealing at a second temperature above the first temperature to convert the intermediate layer to a nickel silicide layer, the nickel silicide layer having a second resistivity of 10.5 micro-ohm*cm, the nickel silicide layer forming a source/drain contact region of a transistor.

2. The method of claim 1, wherein the oxygen-scavenging metal film is a titanium metal film further including forming the titanium metal film by reacting $TiCl_4$ with hydrogen and removing unreacted titanium film by etching in a $TiCl_4$ ambient.

3. The method of claim 1, wherein the exposed semiconductor region comprises silicon, germanium, carbon, tin, gallium, indium, or arsenic, or mixtures thereof.

4. The method of claim 1, wherein the chemically reducing step and the reacting step are performed simultaneously using a heat-treating step.

5. The method of claim 4, wherein the heat-treating step is performed at a substrate temperature between about 400° C. and about 750° C.

6. The method of claim 1, wherein a thickness of the oxygen-scavenging metal film is two times or more of a thickness of the nickel oxide film.

7. The method of claim 1, wherein the oxygen-scavenging metal film is a metal selected from a group consisting of Ti, Sc, Y, La and lanthanides, Zr, Hf, V, Nb, and Ta.

8. A method of forming source/drain regions, comprising:
providing a substrate containing first and second semiconductor regions;
selectively forming a metal oxide film over the first semiconductor region;
forming an oxygen-scavenging metal film over the first and second semiconductor regions, wherein a thickness of the oxygen-scavenging metal film is two times or more of a thickness of the metal oxide film;

chemically reducing the metal oxide film to an elemental metal film by scavenging oxygen from the metal oxide film into the oxygen-scavenging metal film;

reacting the elemental metal film with the first semiconductor region to form a metal semiconductor film;

reacting the oxygen-scavenging metal film with the second semiconductor region to form an oxygen-scavenging metal semiconductor film; and annealing to reduce resistivities of the metal semiconductor film and the oxygen-scavenging metal semiconductor film.

9. The method of claim 8, wherein the oxygen-scavenging metal film is a titanium-containing film further including forming the titanium-containing film by reacting $TiCl_4$ with $H_2$ and removing a portion of the titanium-containing film by etching in a $TiCl_4$ ambient.

10. The method of claim 8, wherein the chemically reducing step and the reacting the elemental metal film and the oxygen-scavenging metal film steps are performed simultaneously by heating the substrate.

11. The method of claim 8, wherein a metal in the elemental metal film, in the metal oxide film, and in the metal semiconductor film is selected from a group consisting of Ni, Os, Co, Ru, Ir, Pd, Pt, and Rh.

12. The method of claim 8, wherein the oxygen-scavenging metal is a metal selected from a group consisting of Ti, Sc, Y, La and lanthanides, Zr, Hf, V, Nb, and Ta.

13. The method of claim 8, wherein the metal oxide film includes a nickel oxide film, the elemental metal film includes elemental nickel metal, and the metal semiconductor film includes nickel silicide.

14. The method of claim 8, further comprising:

removing a remaining portion of the oxygen-scavenging metal film, a remaining portion of the elemental metal film, or both, from the substrate.

15. The method of claim 8, wherein the first semiconductor region is p-type silicon or p-type silicon germanium and wherein the second semiconductor region is n-type silicon or n-type silicon germanium or n-type carbon doped silicon.

16. The method of claim 8, wherein selectively forming the metal oxide film over the first semiconductor region includes forming the metal oxide film over the first and the second semiconductor regions and removing the metal oxide film from the second semiconductor region by masking the first semiconductor region and removing the metal oxide film from the second semiconductor region using an etching process.

17. A method of forming a device, the method comprising:

providing a substrate containing first and second semiconductor regions;

selectively forming a nickel oxide film over the first semiconductor region;

forming a titanium metal film over the first and second semiconductor regions;

chemically reducing the nickel oxide film to an elemental nickel metal film by oxygen scavenging from the nickel oxide film to the titanium metal film;

reacting the elemental nickel metal film with the first semiconductor region to form a nickel semiconductor film; and reacting the titanium metal film with the second semiconductor region to form a titanium semiconductor film, wherein the chemically reducing step and the reacting steps include a heat-treating step;

removing unreacted portions of the elemental nickel metal film and unreacted portions of the titanium metal film after forming the nickel semiconductor film and the titanium semiconductor film; and annealing to:

convert the titanium semiconductor film to a titanium silicide layer, the titanium silicide layer comprising a lower resistance than a resistance of the titanium semiconductor film; and convert the nickel semiconductor film to a nickel silicide layer, the nickel silicide layer comprising a lower resistance than a resistance of the nickel semiconductor film, the annealing being performed at a higher temperature than the heat-treating step.

18. The method of claim 17, further including forming the titanium metal film by reacting $TiCl_4$ with $H_2$ and removing the unreacted portions of the titanium metal film comprises etching in a $TiCl_4$ ambient.

19. The method of claim 17, wherein the first semiconductor region comprises p-type silicon, p-type silicon germanium, p-type germanium, or p-type germanium-tin and wherein the second semiconductor region comprises n-type silicon, n-type carbon doped silicon, or n-type germanium.

* * * * *